United States Patent [19]

Eustance et al.

[11] 4,243,708
[45] Jan. 6, 1981

[54] METALLIZED TEXTURED SURFACE POLYPROPYLENE FILM

[75] Inventors: John W. Eustance, South Glens Falls; Stanley Y. Hobbs, Scotia; Emilie L. Carley, Hartford, all of N.Y.

[73] Assignee: General Electric Company, Hudson Falls, N.Y.

[21] Appl. No.: 30,282

[22] Filed: Apr. 16, 1979

Related U.S. Application Data

[60] Continuation-in-part of Ser. No. 686,834, May 17, 1976, abandoned, which is a division of Ser. No. 554,070, Feb. 28, 1975, Pat. No. 3,964,735.

[51] Int. Cl.³ .............................................. B32B 15/08
[52] U.S. Cl. .................................... 428/141; 361/314; 361/323; 427/81; 428/461; 428/409; 427/516; 427/523
[58] Field of Search ............... 428/461, 523, 516, 409, 428/141; 361/314, 323; 427/81

[56] References Cited

U.S. PATENT DOCUMENTS

| | | | |
|---|---|---|---|
| 2,720,680 | 10/1955 | Gerow | 264/209 |
| 3,335,208 | 8/1967 | Harris | 264/280 |
| 3,585,467 | 6/1971 | Linzey | 361/314 |
| 3,900,774 | 8/1975 | Iijima | 361/314 |
| 3,900,775 | 8/1975 | Takashima et al. | 361/314 |
| 4,071,656 | 1/1978 | Miller | 428/626 |

Primary Examiner—George F. Lesmes
Assistant Examiner—E. Rollins Buffalow
Attorney, Agent, or Firm—J. J. Lichiello

[57] ABSTRACT

A metallized polypropylene film with improved surface impregnation properties for dielectric fluids is disclosed. The film has one predetermined textured surface and is characterized by a space factor of above about 5% and has an electrical conductive metallic coating on one surface.

12 Claims, 7 Drawing Figures

METALLIZED TEXTURED SURFACE POLYPROPYLENE FILM

BACKGROUND OF THE INVENTION

This is a continuation-in-part application of application Ser. No. 686,834 filed May 17, 1976 now abandoned, which was a division of application Ser. No. 554,070 filed Feb. 28, 1975, now U.S. Pat. No. 3,964,735 and assigned to the assignee of the present invention.

This invention relates to a synthetic resin polypropylene film and more particularly to a textured surface polypropylene film defined as a film having a uniformly irregular or raised relief surface whose irregularities are in a predetermined form or pattern and with a predetermined degree of relief.

Polypropylene film has found widespread use as the dielectric medium in dielectric liquid impregnated electrical capacitors. In the production of one such capacitor as illustrated in U.S. Pat. No. 3,363,156, very thin polypropylene strips are interleaved with aluminum foil strips and the composite wound into a tight roll form. The roll is placed in a suitable housing and impregnated with a dielectric liquid impregnant. Alternatively the aluminum foil strips may be replaced with metal coatings formed on appropriate dielectric strips, often referred to as metalized capacitors. Polypropylene film, as produced by the well known blown tube and draft and tentering processes, usually has very smooth blocky surfaces which tend to cling very tightly to each other or to other adjacent surfaces. This creates a problem in attempting to impregnate the film when incorporated in a tightly wound capacitor roll. It is particularly difficult to cause the impregnant, such as an oil, to completely permeate the capacitor roll particularly into the interfaces of polypropylene strips and polypropylene and foil strips.

For this reason many prior art attempts have been made to expedite impregnation of capacitor rolls by roughening the adjacent film strips, foils, etc. whether by etching, embossing, abrading, or forming processes. The result of these processes have not been entirely satisfactory for a number of reasons. Particularly, many of these roughening processes tend to affect the physical strength of the film as well as its dielectric strength. Also forming processes which increase the overall thickness of film, such as corrugation and embossing, increase the overall thickness of the roll and therefore make the final roll excessively large. The blown tube process has been noted to produce film having surface areas which are slightly roughened. However, the roughness was non uniform and sporadic, and not subject to predetermination in the film making process.

OBJECTS OF THE INVENTION

Accordingly, it is an object of this invention to provide an improved uniformly textured or irregular surface on polypropylene film.

It is another object of this invention to continuously provide, in the film manufacturing process, a uniformly textured surface on polypropylene film which preserves film strength and integrity while improving impregnation characteristic.

It is a further object of this invention to provide, by means of the control parameters in a blown tube film manufacturing process, a uniformly textured surface on polypropylene film whose irregularities are of increased concentration and degree of raised relief.

SUMMARY OF THE INVENTION

In one preferred form of this invention, the polypropylene tube or stalk emanating from an extruder in a film making process has a section thereof primarily temperature controlled and correlated to the stalk velocity to cause extensive continuous and uniform spherulite formation with predominantely type III polypropylene crystal structure on the outer surface of the stalk. Subsequent inflation of the stalk causes the desired texture or irregularity to occur on the outer surface of the inflated tube.

DESCRIPTION OF THE DRAWING

This invention will be better understood when taken in connection with the following description and drawing in which.

DESCRIPTION OF PREFERRED EMBODIMENTS

Figure 1:
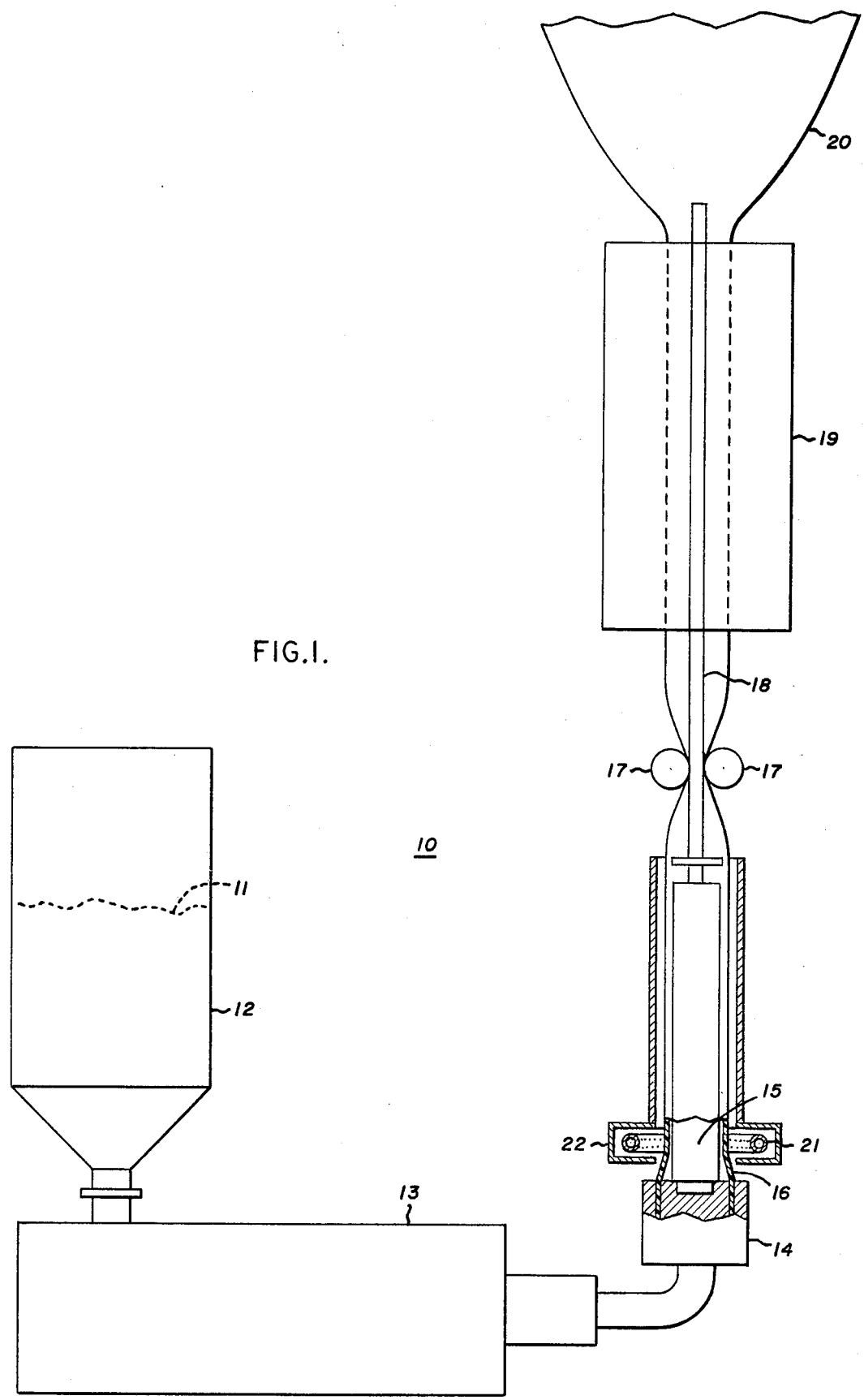
FIG. 1 is a schematic illustration of a blown tube or bubble process employed for producing polypropylene film.

Referring now to the blown tube apparatus 10 of FIG. 1, polypropylene resin in the form of pellets 11 are fed into a hopper 12 and then into an extruder 13 where they are heated to form a very soft or molten mass of polypropylene. This mass is extruded from the extruder 13 through a die 14 in tubular form and comes into contact with a cooling mandrel 15 where it begins to crystallize in the form of a stalk 16. From the cooling mandrel 15, the stalk 16 is pulled through a pair of rolls 17 which compress the stalk in sealing relationship to an air tube 18 which passes therebetween in a groove in the rolls. After passing the rolls 17 the cooled and crystallized stalk 16 is reheated to its softening temperature by a suitable heating means 19, for example, radiant heaters, and then insufflated by introducing air under pressure through air tube 18. Insufflation provides a controlled bubble or large tube 20 which stretches the polypropylene stalk in both the horizontal and vertical direction by a factor of about 6 to provide biaxially oriented polypropylene film. The bubble 20 is then collapsed through frame rollers 21, between a pair of nip rolls 22 and hauled off to a slitter 23 where the flattened bubble is slit into one or more strips which are then wound on take-up winding rolls 24. Typical structures and processes for producing films from a blown tube process are found in U.S. Pat. No. 2,720,680 of Gerow; U.S. Pat. No. 3,235,632 of Lemmer; and U.S. Pat. No. 3,223,764 of Kahn, and U.S. Pat. No. 3,335,208 of Harris.

Ordinarily, in a blown tube film making process the mandrel cooling temperatures, the stalk temperatures, and the frost line are fairly established conditions and their ranges are quite limited. For example, the temperature of the polypropylene emanating from the die 14 is at about 455° F. with the frost line temperature being about 200° F. Under these conditions the crystallization characteristics of the stalk are also fairly established and the type of crystal formation is somewhat constant.

In the practice of the above described film making process, it was found that from time to time certain surface irregularities, e.g. roughened areas, appear in the film. These irregularities differed markedly from batch to batch of film and were also not uniformly distributed over the surface or coextensive with the surface of a film of large area. Typically these irregular surfaces were non uniform both with respect to distribution over the surface of the film and non uniform with respect to the degree of the irregularity. In addition, the pattern of irregularity formation was not the same over the surface of the film and, the presence or absence of irregularities was not readily predetermined, and at times was considered accidental.

The irregularities on the film surface created on opaque kind of film surface which was believed in many cases to be less desirable than clear smooth film surfaces. It was then discovered that some of this roughened film had some quite desirable impregnation characteristics. For example, when selected samples of maximum roughness of this film were used to wind experimental capacitor rolls, the film did not cling or stick to itself or adjacent surfaces. Also, the roughness of the film provided a certain degree of separation of adjacent surfaces so that an impregnating liquid could more easily enter the space. Accordingly not only did enhanced and uniform roughness become a desirable feature, but also its predictability, control, and uniformity as applied to a film making process become necessary criteria.

It has now been discovered that certain blown tube process temperature controls may be employed to factually predetermine the presence or absence of texture or irregularities on the film surface. Even more importantly, it has been discovered that these irregularities can be produced uniformly over the film surface in increased concentration and degree of relief. Where irregularities are of a certain kind, and the surface pattern of irregularities is uniform over the total surface of the film, and where the degree of raised relief falls within prescribed limits and is also uniform over the surface of the film, the film is described as textured film in accordance with this invention.

Measurement of surface texture or roughness may be given in terms of haze or haziness of film. Haze is determined by the measurement of light passing through a section of the film, i.e. generally perpendicularly through the top and bottom surfaces rather than edgewise. In the practice of the present invention, a Gardner Laboratory Haze Meter, a commercially available device of Gardner Laboratory Corporation, Bethesda, Md., catalog #HG1204, was employed. Also utilized was a digital photometric unit, catalog #PG5500. The Haze Meter directs light through the film and measures the intensity entering the film. Values obtained are given in terms of percent haziness of the film. Test methods employed were standard American Society for Testing Materials, Tests ASTM-D1003, ASTM-D1044 and FTMS 406, Method 3022.

With a Haze Meter, measurements are taken at small intervals across a film strip, for example, 15 measurements for a film strip about 1 meter in width. An average reading is taken for the 10 highest haze readings, and an average is taken for the lowest 5 readings. The haze description given to the total film is a composite of the two averages, e.g. 40/20 haze. When a single haze number is given, the number, for example, 30% haze, is the single number obtained from the Haze Meter.

Also, a Gardiner Gloss Meter was employed, catalog #GG9042 utilizing ASTM test D2457-70. This device measures reflected light from a film surface; also in terms of haze.

The surface texture and haze of the film may be controlled by effectuating or controlling the temperature conditions of a predetermined area of the stalk, in the equipment of FIG. 1, and may be clearly demonstrated by heating or cooling a specific small area of the stalk by rapid spray cooling, for example, and noting the resultant haze differences in the bubble. Temperature control may be applied to the stalk 16, for example, in the form of a heater ring 25 in chamber 26 as illustrated in FIG. 1. A suitable temperature control fluid such as air may be circulated through one or more rings 25 to spray through suitable apertures therein and come into contact with stalk 16, and thereby elevate or reduce the temperature of the stalk 16 over a predetermined axial length thereof. Such heating or cooling may be obtained from many kinds of apparatus known in the art which can elevate or reduce the temperature of an object moving therethrough whether by direct or indirect contact, by liquids or gasses, or by radiation, as typical examples.

Temperature control, however, must be exercised at a predetermined position or area of stalk 16. Polypropylene extrudes from the die 14 in a molten condition and approaches and moves coaxially about mandrel 15 to be progressively cooled and crystallized as stalk 16. In the cooling of stalk 16, a circumferential "frost" line or margin 16 (a) appears at a position of about 6 inches to 24 inches from the die 14. This line is a visible one and is the crystallization line denoting the general area by which full crystallization of the polypropylene stalk has occurred. The temperature control of this invention, which is ordinarily heat addition to or slow cooling of the stalk, must be applied after the die and before the frost line, and preferably at an intermediate section.

The textured film of this invention is effected through temperature control which causes formation of a skin effect or specific crystal layer in the stalk. The skin effect in the stalk may be described as a layer at the outer surface of the stalk which comprises an area of markedly increased density of spherulites of type III polypropylene crystals. It is the presence of this skin effect in the stalk which, when the stalk is biaxially oriented in the bubble, transforms the outer surface into the textured surface of this invention. One explanation relating the type III crystals to texture is that the type III crystal is a transient crystal in the film making process. Tests have shown that the type III polypropylene crystal melts during the reheating process at heating means 19 (FIG. 1) just prior to bubble stretching which is carried on at a draw ratio of between about 5 and 6 to 1 and a blowing ratio of between about 5.5 and 6.5 to 1, with the draw ratio being the axial stretching of the polypropylene and the blowing ratio being the lateral stretching of the bubble diameter to the stalk diameter. Reheat temperatures are between about 285° F. and 310° F. The type III polypropylene crystal in the stalk has a density of about 0.8 gms/cm$^3$ (grams per cubic centimeter) and upon passing through the reheat over 19 transform to the types I and II crystals which have densities on the order of 0.9 gms/cm$^3$. Consequently the stretching of the bubble in combination with the density change of the crystals results in a discontinuity or crater-like effect which provides the texture surfaces.

Further descriptions of the type III polypropylene crystal structure, which is referred to as the Beta crystal structure, and its characteristics are found in the following articles, (a) "Shear Induced β Forum Crystallization in Isotactic Polypropylene", Dragaun et al, Journal of Polymer Schience, Vol. 15, 1977, pages 1779–1789, (b) "Studies on the α and β Forms of Isotactic Polypropylene by Crystallization in a Temperature Gradient", Lovinger et al, Journal of Polymer Science, Vol. 15, 1977, pages 641–656, and (c) *Polymer Single Crystals*, P. H. Giel, Interscience, pages 266–268, 514 and, "Transcrystallization Induced by Mechanical Stress on a Polypropylene Melt", D. G. Gray, Polymer Letters Edition, Vol. 12, pages 645–650 (1974).

The texture surface of the polypropylene film of this invention is correlated to the nucleation and melting of the type III polypropylene crystal structure. As indicated, what is desired is a predetermined increase in density (skin effect) of the type III crystals and the immediate stretching of the film during the time that these crystal structures are melting. Accordingly, the process conditions of the temperature from the extruder to the insufflation and the times involved are controlled so that nucleating conditions become more favorable and significantly more type III crystal structures are produced than would be produced for normal operation of a film line. Films with a space factor (as hereinafter defined) of above about 5% are clearly derived from process control variations which not only are not the optimum for ordinary clear film production, but also produce the enhanced skin effect.

The skin effect which gives rise to textured film is enhanced by establishing a certain temperature differential between the polypropylene stalk at the mandrel surface and at an opposite point at the outer surface of the stalk. This temperture differential is also combined with the fact that the stalk is under tension as it is being pulled by the nip rolls 17. Therefore additional cooling or heating of the stalk changes the tension and stress therein. An increase of temperature results in the generation of shearing stresses in an on going process and provides a greater degree of nucleation in the outer surface of the stalk with more spherulites with type III crystal structure. This increased density of crystals in the outer surface define the skin effect. An important factor in textured film is the formation of the skin effect on one surface of a stalk as the stalk is being processed to a final film form by means of a specific temperature control. The skin effect is a physical one and is clearly discernible in a photomicrograph of a stalk section.

The skin effect is caused to occur in one practice of this invention by elevating the temperature of the outer surface of the stalk by means of heater ring 25 well before the frost line, very rapidly, without adversely disturbing the frost line, and without disrupting the essentially balanced heat flow conditions at the mandrel and in the stalk which provide for good stalk formation. Under these conditions it is believed that a favorable temperature gradient or environment in the stalk is established which is favorable to subsequent skin effect nucleation. Furthermore the sudden addition of heat to a specific portion of the outer surface of the stalk, or the sudden prevention of heat transfer therefrom permits the existing tension to stretch that portion of the stalk and this stretching or shearing also favors nucleation. The application of heat and the consequent shear stresses at a defined location. before and adajcent to the frost line contributes to the production of the textured film of this invention. The amount of heat input on the outer surface temperature of the stalk is best determined by empirical relationship and visual determinations, since the skin effect and the resultant texture are clearly physical states which are easily measured.

Temperature control of this invention may be exercised without actual separate heat addition. For example, a temperture distribution or gradient from the inside surface to the outside surface of the stalk and a higher transient temperature at the outside are the characteristics which favor the described skin formation. Best results are obtained when the distribution curve is steep and the markedly higher temperature is at the extreme outer surface. For example, in one practice of this invention, following the illustration of FIG. 1, the polypropylene resin was isotactic polypropylene commercially available from Dart Industries and extruded at the die ordinarily at about 450° F. However, for this example the temperature was reduced to about 435° F. The mandrel/film relationship was sliding friction of the film surface directly adjacent the metal mandrel. Stalk diameter was about 6 inches diameter, the wall thickness was about 17 mils and axial progress along the mandrel was about 35 feet per minute. A more uniform stretching of the stalk was taking place and the resultant shearing stresses favored nucleation. At this point mandrel cooling was progressively reduced to effectuate an elevated temperature in the stalk without adversely affecting the frost line. Cooling may be slightly reduced along the mandrel or at a more specific location with a resulting higher temperature in the outer surface of the stalk. At this point, heat radiation to the environment may also be controlled by suitable shrouds or heat reflectors in the control zone along the mandrel 15. By this means a skin effect is also formed on the stalk and a textured film is produced in the bubble. Haze measurements made on film produced in the above example showed a range of from 20 percent to 40 percent depending on the control temperature of the stalk at heater ring 25.

The underlying concept of this invention is the predetermined change in temperature at a critical location in the film making process, e.g. between the extruder and the stretching operation, in order to enchance or facilitate nucleation of the type III polypropylene crystal structure. More specifically, the change in temperature occurs after the point where the molten resin from the extruder solidifies and before the stretching operation. In the first instance, by decreasing the extruder temperature the ordinary result would be to slow the crystallization. Secondly, the heating or cooling of the stalk provides a controlled temperature and temperature gradient. Accordingly, prime conditions are set for the type III crystal structure skin effect. Consequently, the concept of this invention is applicable to other processes of film making, such as the draft and tentering process. In this latter process, polypropylene resin is extruded and cooled or solidified in a thick strip form. This strip is thereafter reheated and stretched both laterally and longitudinally.

Figure 2:
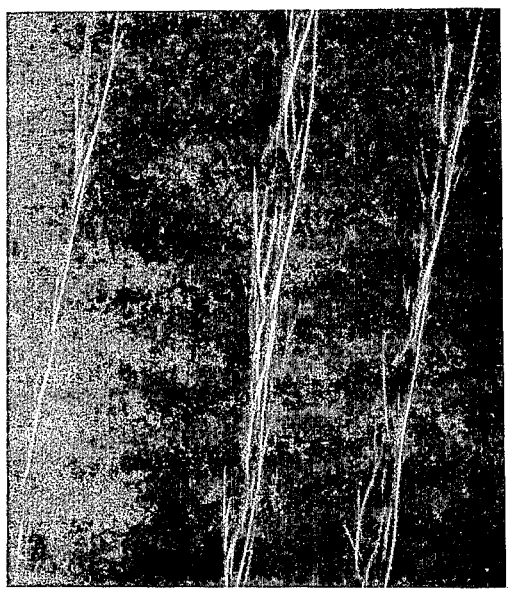
FIG. 2 is a photomicrograph of a non textured film.
Figure 2:
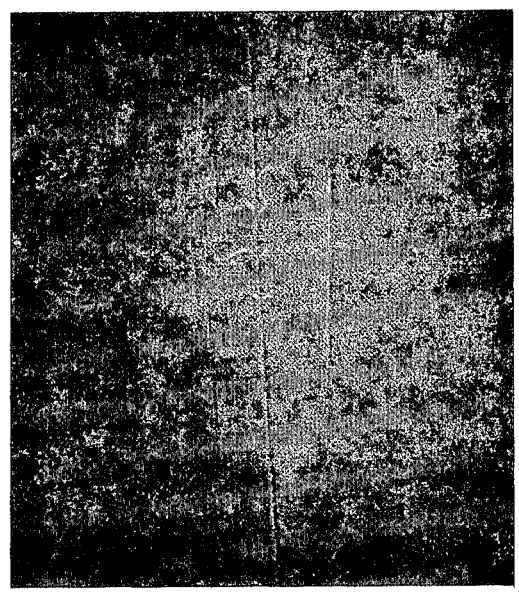

Polypropylene produced by practice of this invention has a high degree of surface texture, and the texture is uniquely uniform and similar over the entire film surface. The specific textured structure is illustrated and compared in FIGS. 2 through 6. Referring now to FIG. 2 there is illustrated a photomicrograph of a piece of relatively smooth polypropylene film made by a prior bubble process. This film is 0.70 mil thick and shown at 75X magnification. What is shown are a few straight scratch lines and several small circumferential lines which may be the ridges of slight cavities or depressions.

Figure 3:
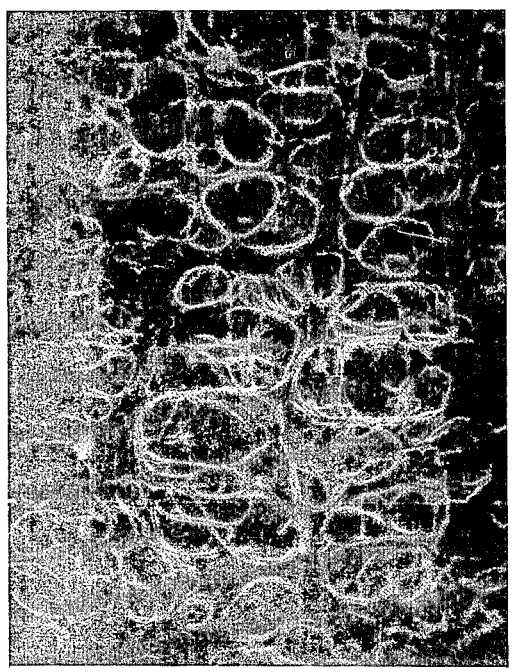
FIG. 3 is a photomicrograph of a piece of polypropylene film illustrating surface irregularity of 20% haze.
Figure 3:
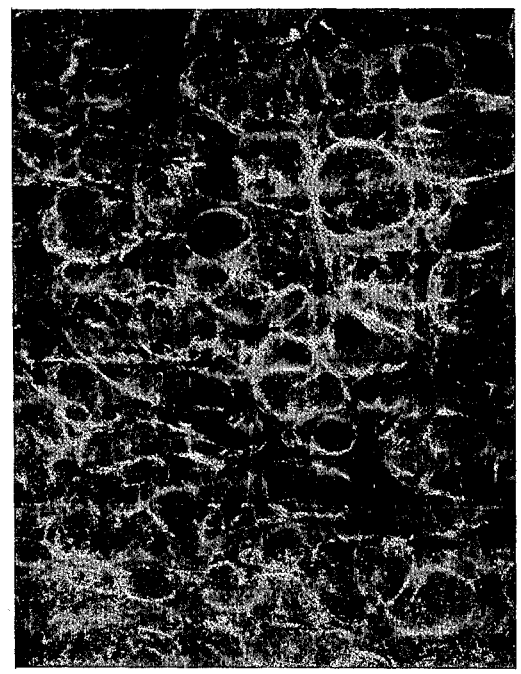

Referring now to FIG. 3 there is illustrated a photomicrograph of a piece of 0.70 mil. thick textured polypropylene film having about a 20 percent haze measurement in accordance with the measuring practices of this invention as described, and also at a magnification factor of 75X. The circumferential fibroids or ridges defining craters or depressions are now clearly visible and proliferate. It is this fibroid surface which provides the textured effect in the film. The raised fibroids or ridges may be elevated 2–3 microns above the ordinary gage thickness of the film and they are uniform and continuous. Uniformity and continuity means that a continuous run of film, i.e. several yards at least, or a bobbin supply of film has the configuration and density of FIG. 3 coextensively over one surface. Under some predetermined conditions the 2 to 3 microns fibroids may be correlated to a haze value of between about 20 percent to 30 percent. The texture of this invention is limited to the surface of the film. It is a surface layer concept and not one that involved the total film thickness. Likewise, the haze measurements relate to surface texture and not to internal impurities.

Figure 4:
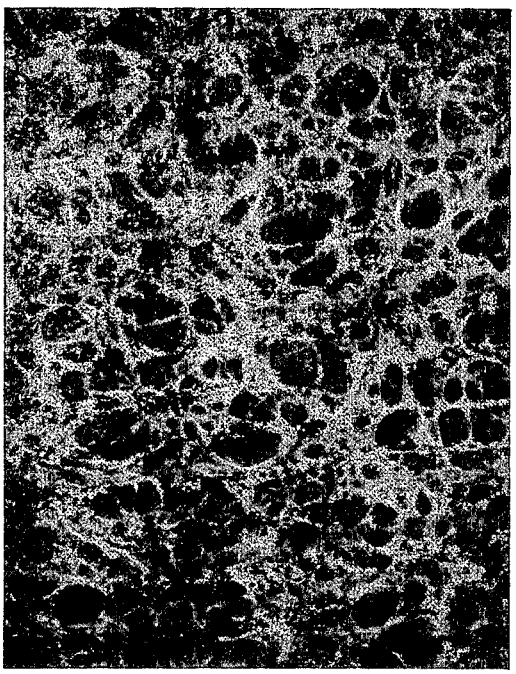
FIG. 4 is a photomicrograph of a piece of polypropylene film illustrating surface irregularity of 30% haze.
Figure 4:
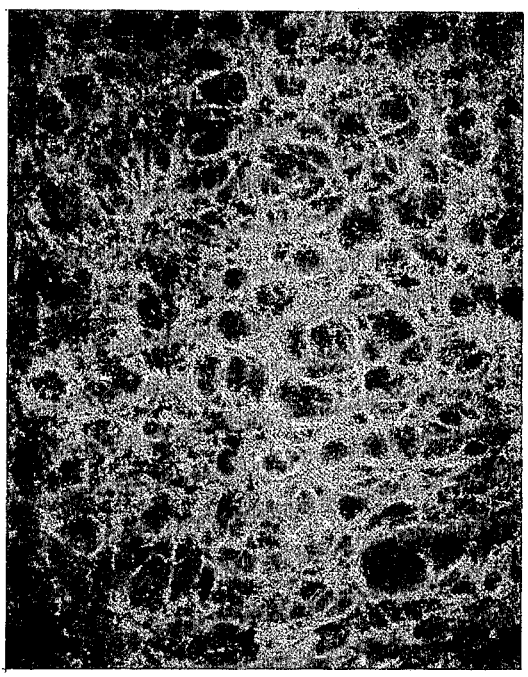

Referring now to FIG. 4, there is illustrated a piece of polypropylene film of 0.70 mil in thickness magnified 75X whose haze reading is about 30% in accordance with the light measuring practices of this invention. In this illustration there are as described a great number of fibroids or craters intertwined and overlapping, and coextensive and uniform over a continuous run of film. The illustration gives an appearance of a pressed matte of very thin loose fibers. The structure is very conducive to impregnation, is non-sticky and represents a good example of the textured film of this invention.

Figure 5:
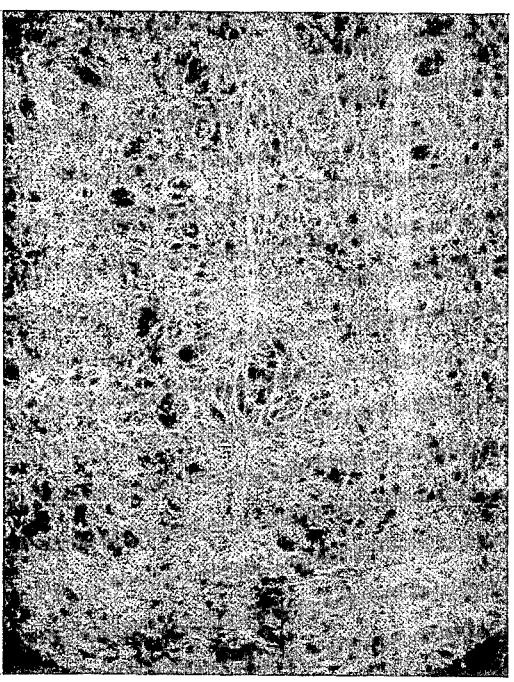
FIG. 5 is a photomicrograph of a piece of polypropylene film illustrating surface irregularity of 40% haze.
Figure 5:
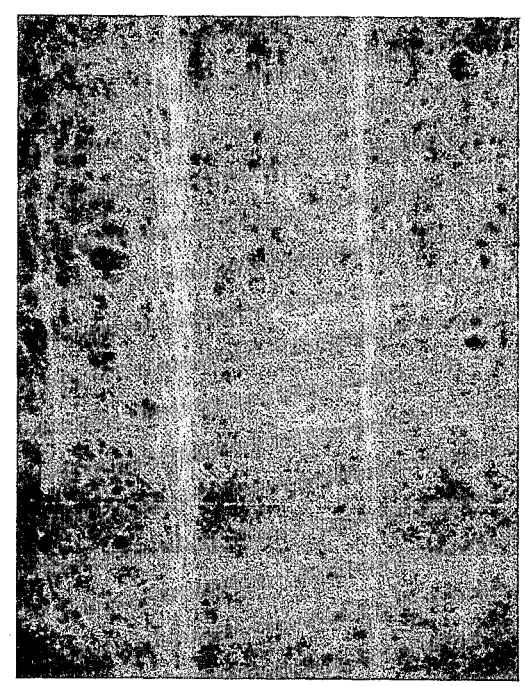

Referring now to FIG. 5 there is illustrated a piece of polypropylene film of 0.70 mil thickness magnified at a factor of 75× and whose haze measurement by the practice of this invention is greater than about 40%. FIG. 5 illustrates myriads of crater-like depressions defined by fibrous-like raised ridges in overlapping and intertwined relationship. The appearance is somewhat similar to crackle glass. FIG. 5 represents an excellent form of film surface texture of this invention. Textured film of this invention is believed to be related to the skin effect above described, and the stress nucleation effect. The enhanced texture is so controlled by these factors that it is now caused to appear as a complete or coextensive pattern over a substantial supply of film, i.e. a bobbin supply from which many capacitor rolls can be wound.

Figure 6:
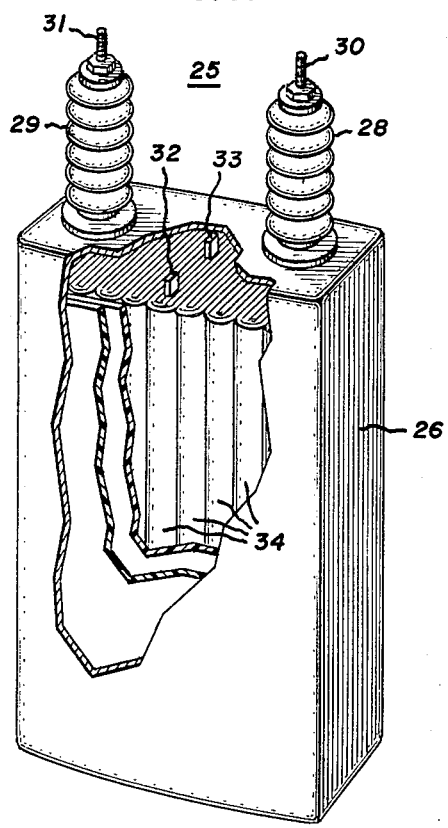
FIG. 6 is an illustration of a capacitor embodying the textured film of this invention.

Textured films produced in accordance with the teachings of the present invention were incorporated in an electrical capacitor structure as illustrated in FIG. 6. Referring now to FIG. 6 there is disclosed a capacitor 27 embodying the textured film of this invention. Capacitor 27 typically follows the design and process set out in U.S. Pat. No. Re 27,824 of Cox; U.S. Pat. No. 3,754,173 of Eustance; and U.S. Pat. No. 3,724,043 of Eustance.

In FIG. 6, capacitor 27 may be denoted as a high voltage AC power capacitor and more particularly a power factor correction capacitor. Capacitor 27 includes an appropriate casing member 28 with a cover 29 sealed thereto. Capacitor 27 is provided with insulating bushing members 30 and 31 which insulate terminals 32 and 33 from cover 28. Terminals 32 and 33 provide an electrical connection (not shown) to tap straps 34 and 35 of the roll sections 36 in the casing 28. Roll sections 36 are more fully described with respect to FIG. 7.

Figure 7:
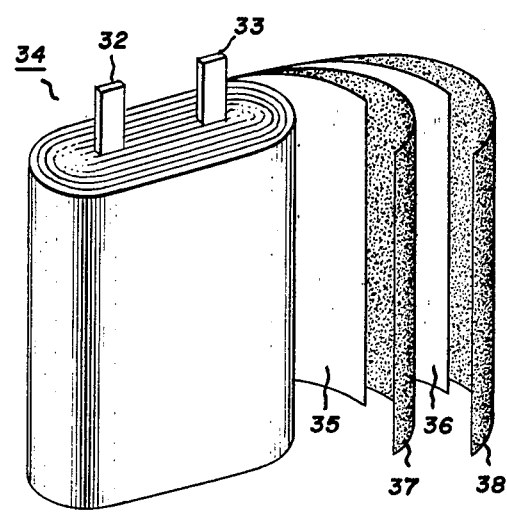
FIG. 7 is an illustration of a capacitor roll embodying the textured film of this invention.

Referring now to FIG. 7, there is illustrated a common example of a convolute or roll section 36 for use in an impregnated type capacitor either of the high voltage AC type above described or in smaller motor run type of capacitor. A roll section 36 usually comprises alternate strips, 37 and 38, of a metal foil, and polypropylene film dielectric 39 and 40. In a preferred practice of this invention, polypropylene strips 39 and 40 are usually less than 0.001 inch thickness and foil strips 37 and 38 are of aluminum. Placed adjacent the foil strips at appropriate locations in the roll are tap straps 34 and 35 which are utilized as electrical connections for the electrode foil strips, and are suitably connected to terminals 32 and 33. The noted strips are fairly tightly wound in roll form and then flattened to the illustrated configuration.

Impregnation of the capacitor 27 usually takes place by means of introducing an impregnant into one or more small holes in cover 28 which thereafter are solder sealed. During impregnation the capacitor 27 is generally submerged in a liquid impregnant which fills casing 28 and impregnates the roll sections 36 therein. Certain pre-evacuation cycles, high temperatures and other process steps are also usually employed.

One of the major processing disadvantages present in impregnated capacitors, particularly roll section capacitors, is the difficulty of obtaining essentially complete impregnation of the roll. In order to provide, for example, a high voltage (above about 600 volts), AC power factor correction capacitor, essentially complete impregnation should include a filling of all significant air spaces or voids between the electrodes, whether these voids and interstices are between adjacent dielectric strips, between dielectric strips and electrode strips, or within the dielectric materials.

In a wound roll section such as illustrated in FIGS. 6 and 7, the impregnant must proceed axially through the roll to reach the inner most portions. If the dielectric material is porous, or will otherwise absorb and transmit or pass the impregnant under the conditions of impregnation, then the impregnant not only may pass rapidly axially through the roll, but also may pass transversely through adjacent dielectric strips. The textured film of this invention, whether adjacent another textured surface or a foil surface or a film surface, will provide by means of its irregular surface, certain openings, apertures, and passageways which facilitate the entry and passage of the impregnant deep into the roll. These fluid filled spaces are the most important criteria of the textured film of this invention. The available space in a capacitor roll section as described is referred to as space factor.

In accordance with this invention, space factor is a term denoting the relationship of the theoretical or solid volume of, for example, a polypropylene film strip compared to the overall volume the film strip occupies. For example, a film strip having a roughened surface can have its overall thickness measured to provide a given dimension from which a first calculation is made of the volume. This volume, however, includes the intervening spaces such as valleys between the protuberances or peaks of roughness. A second calculation can be made on the actual volume of solid material in the strip. The difference between these calculations divided by the weight thickness is the space factor given in percent of available space in a roughened film over a theoretical solid volume, e.g., a 10% space factor indicates 10% of the measured volume is not occupied by solid material. The weight average thickness is measured by weighing a film sample of known length, width, and density, and calculating the thickness. The volume average thickness is obtained by measuring film thickness with a micrometer. The difference between the two thicknesses divided by the weight average thickness is the space factor.

Space factor is the most important measurement in capacitor films. While a haze measurement based on light transmission does provide some indication of roughness, it is unduly influenced by internal colorations and asperities in the film which effect light transmission. Moreover the light transmission method may only give an approximation of space factor. For example, if a given film surface had only a few peaks arising from its surface, the light transmission method of measurement would indicate low haze. Actually the film would have a high space factor. If the given film had a great number of small peaks, the light transmission method would give a high haze reading, when actually the film had a low space factor. A high haze reading is correlated to high space factor, e.g., only when predetermined process conditions are attained. In the practice of this invention polypropylene films may be produced with space factors above about 30% with a typical range of between about 5% to 25%.

In a further exemplary practice of this invention capacitors were made up as described with respect to FIG. 7 with strips of textured polypropylene and other identical capacitors were made up with smooth polypropylene dielectric strips. Results are as follows

TABLE 1

| Life Test V-AC/°C. | No. Failed/Tested 5500 Hrs. | |
|---|---|---|
| | Smooth Film | Textured Film |
| 775/70° C. | 6/10 | 2/10 |
| 660/85° C. | 4/10 | 0/10 |

Capacitors for the following test utilized strips of 50 gauge polypropylene and were 2 Uf 540V-AC units:

TABLE 2

| Life Test | Smooth Film | Textured Film |
|---|---|---|
| Total Failed/Tested at 500 Hrs. | 17/70 | 2/25 |

Other examples and descriptions of capacitors using the textured film of this invention are found in copending U.S. patent application of Newcomb, Ser. No. 952,384, assigned to the same assignee as the present invention. Examples I and II and the following introduction portion are taken from the aforementioned application.

Impregnation of the capacitors of this invention may follow the usual practices associated with polypropylene film capacitors, for example, as disclosed and claimed in U.S. Pat. No. 3,363,156. It is preferred however, to utilize a lower temperature drying and evacuation process in the range of about 90°–110° C. and less than about 60 microns of Hg pressure, and a filling process where the capacitor is at 50°–80° C., and the fluid is at 40°–50° C. Subsequently, the capacitors are placed in an oven and their temperatures elevated into a range between about 60° C. and 100° C., and preferably between about 65° to 90° C. for as much as 40 hours.

The following examples are typical of the excellent results following the teachings of this invention. The capacitor space factor used were in the range of from about 5% to about 8%. Film roughness varied from about 10% to 30% space factor of the polypropylene film only. The fluids used were PXE (Fluid A) which was purchased from Nippon Chemical Company as Nisseki Condenser Oil S and contained about 97% phenyl zylyl ethane with the balance a mixture of isomers, and MIPB (Fluid B) which was purchased from Sun Oil Company as Sure-Sol 250. In each case the fluid was carefully refined to high purity and about 0.6–0.8% by weight of an epoxide such as ERL 4221 (commercially available from Union Carbine Company U.S.) and from about 0.01% to 0.10% by weight of an antioxidant material such as 2,6-di-t-butyl-p-cresol were added thereto.

EXAMPLE I

A number of capacitors were assembled in accordance with the structure of FIGS. 3, 5 and 6 following the preferred practices set forth. The capacitor rolls were 10.62 inches (26.97 cm) in length and comprised patterned aluminum foil electrodes of about 0.22 mil (5.6 micron) thickness with 100 dimples per inch (2.54 cm) and two sheets of polypropylene film having about 10% to 30% space factor, one strip having a thickness of 0.70 mil (18 microns) and the range of 85° C. to 100° C. and a vacuum of less than 60 microns Hg. for about 26 hours. The capacitors were then allowed to cool to the range from about 50° to 80° C., and the impregnating fluid at a temperature of about 40° to 50° C. was introduced into the capacitor under vacuum. After filling, the capacitors are placed in an oven and the temperature raised to from about 65° C. to 85° C. After stabilization at temperature, the capacitors were left to soak in the oven for about 20 hours after which temperature is reduced to room temperature. This soaking was repeated a second time for an additional 20 hours. Thereafter the capacitors were brought to room temperature, sealed and given certain electrical tests.

In the table below, DIV is discharge inception voltage also known as corona start voltage, and the values given are the averages of three readings. DEV is discharge extinction voltage, also known as corona extinction voltage. Dissipation factor is %DF or tan $\phi$ (loss angle) and is given as a watts loss percentage. The results show repetitive excellent capacitors as follows; albeit that the design and test criteria of these capacitors are inordinately severe.

TABLE 3

| Diel. Thickness u | Diel. Volts | Test Volts | uf Roll | DIV Av | DEV Av | DIV 250 Hrs | DEV 250 Hrs | DIV 1000 Hrs | DEV 1000 Hrs | T° C. |
|---|---|---|---|---|---|---|---|---|---|---|
| 35.0 | 1680 | | 7 uf | 3100 | 2600 | | | | | 25 |
| 35.0 | 1680 | | 7 uf | 3200 | 2500 | | | | | 25 |
| 35.0 | 1680 | | 7 uf | 3300 | 2600 | | | | | 25 |

TABLE 3-continued

| Diel. Thickness u | Diel. Volts | Test Volts | uf Roll | DIV Av | DEV Av | DIV 250 Hrs | DEV 250 Hrs | DIV 1000 Hrs | DEV 1000 Hrs | T° C. |
|---|---|---|---|---|---|---|---|---|---|---|
| 35.0 | 1680 | | 7 uf | 3100 | 2500 | | | | | 25 |
| 43.0 | 1990 | | 4 uf | 3700 | 3000 | | | | | 25 |
| | | | | 3200 | 2700 | | | | | 80 |
| 43.0 | 1990 | | 4 uf | 3000 | 2400 | | | | | 25 |
| | | | | 3400 | 3100 | | | | | 80 |
| 43.0 | 1990 | | 4 uf | 3900 | 3000 | 3700 | 3300 | | | 25 |
| | | | | 4250 | 2200 | 3400 | 2700 | | | 80 |
| 43.0 | 1990 | | 4 uf | 3900 | 3200 | 3800 | 3500 | | | 25 |
| | | | | 5200 | 4300 | 3300 | 3000 | | | 80 |
| | 1990 | | 4 uf | 3600 | | 3000 | | 3200 | 3100 | 25 |
| | | | | 3600 | | 3100 | | 3000 | 2700 | 25 |
| | | | | 3700 | | 3100 | | 3600 | 3400 | 25 |
| | | | | 3500 | | 3000 | | 3800 | 3400 | 25 |

As can be seen from the above data, these capacitors were subject to severe voltage stress and show very high and stable and repetitive DIV and DEV values. When the noted units were placed on rated voltage of life testing, a first retest occurred at 250 hours indicating that no units had failed and no significant changes had occurred. Life testing was then continued for a total of 1000 hours, and a retesting occurred on representative units from each example. The DIV and DEV values remained satisfactory with an overall improvement. Dissipation factor and capacitance tests showed excellent values with dissipation factor improving with time, i.e., 120% of rated voltage for 1000 hours and being about 0.01% at 85° C.

EXAMPLE II

The capacitor rolls were of narrow design 10.62 inches wide (26.9 mm) and relatively smooth film, e.g., low space factor (LS) are included. High space factor (HS) film had an average space factor of about 20%. Capacitor space factor was about 5%. The voltage rating of the dielectric was moderate, i.e., about 1200 volts. In the table below DC is Direct Current, AC is Alternating Current, Vr is rated voltage. The capacitors were rated at 7960 volts and 200 VKAR.

TABLE 4

| Film | DC 6.5 × Vr | AC 3 × Vr | 250 Hrs 6.25 × Vr | DC 6.25 × Vr |
|---|---|---|---|---|
| LS | 1/6 | 0/3 | 0/3 | 1/3 |
| HS | 3/6 | 0/3 | 0/3 | 0/3 |

The textured film of this invention may have an electrically conductive coating on either its textured surface or its opposite surface. Metallic coatings, such as aluminum, do not adhere as strongly as desirable on a smooth polypropylene surface. The kind of irregularity and the pattern of the irregular surface of the textured film of this invention provide better contact between the metal layer and the film and an improved bond. When the metal coating is on the smooth side of the film an improved composite is produced, i.e., an electrode, a dielectric film and a textured surface. Such metallized strips have an important application in capacitors and eliminate the need for a separate electrode foil.

The textured film of this invention provides the major advantage of facilitating impregnation. Because the texture is uniform over the film the impregnation cycle can be programmed to include this benefit. Because the roughness of the textured surface is of a considerable magnitutde, liquid penetration is facilitated between the textured surface of a polypropylene strip and adjacent surfaces, whether of textured polypropylene or other materials.

The invention is applicable to crystallizable thermoplastic materials generally whose manufacturing characteristics approximate those of the isotactic polypropylene of this invention. Included among these materials are forms of polypropylene such as syndiotactic polypropylene and the copolymers and homopolymers of polypropylene as well as blends or of polypropylene with other synthetic resins. Also included are the other crystallizable polyolefins.

The textured film of this invention may be gainfully employed as electrical insulation materials and products particularly when winding and unwinding procedures are involved, or impregnation or drying cycles are required. The textured surface facilitates winding and reeling because of its non stickiness characteristics, and provides passageways for removal of vapors in a drying cycle. More importantly the rough surface provides passage for the release of air entrapped in the winding process. The textured film of this invention is also particularly adaptable for printing thereon. One prior problem with smooth films is that commercial ink stamping would not bond well and was easily erased. The rough surface of textured film provides better surface characteristics for inks and prints.

While this invention has been disclosed with respect to particular embodiments thereof, numerous modifications may be made by those skilled in the art without departing from its true spirit and scope. Therefore, it is intended that the appended claims cover all such modifications and variations which come within the true spirit and scope of the present invention.

What is claimed as new and desired to be secured by Letters Patent of the United States is:

1. A metallized film with improved surface impregnation properties for dielectric fluids which comprises a thin polypropylene film having one predetermined textured surface which is coextensively and uniformly covered by an overlapping pattern of fibroid irregularities comprising predominantly a stretched layer of Type I and Type II crystal structure, said film being characterized by a space factor of greater than about 5% and a haze measurement of greater than about 20%, and said film having an electrically conductive metallic coating on one surface.

2. The metallized film of claim 1, wherein said polypropylene film is produced by the steps of extruding polypropylene into a stalk, cooling the stalk to crystallize the polypropylene, passing the stalk through a heating zone and biaxially stretching the stalk through a heating zone into a thin film.

3. The metallized film of claim 2, wherein said stalk emanating from the extruder has a section primarily temperature controlled to the stalk velocity to cause extensive, continuous and uniform spherulite formation with a predominantly type III polypropylene crystal structure on the outer surface of the stalk, which upon subsequent inflation of the stalk caused the desired texture to occur.

4. The metallized film of claim 1, wherein said polypropylene consists of isotactic polypropylene.

5. The metallized film of claim 4, wherein one surface of the film is substantially smooth and flat and the opposite surface is a textured surface which is substantially uniform over the film to provide a space factor of above about 10% of the film having a thickness of between 12.5μ to 20 μ.

6. The metallized film of claim 4, wherein said polypropylene film has a textured surface as shown in FIG. 3.

7. The metallized film of claim 4, wherein said polypropylene film has a textured surface as shown in FIG. 4.

8. The metallized film of claim 4, wherein said polypropylene film has a textured surface as shown in FIG. 5.

9. The metallized film of claim 4, wherein the textured surface consists essentially of raised fibroids elevated 2 to 3 microns above the ordinary gage thickness of the film and coextensive over said one textured surface.

10. The metallized film of claim 1, wherein the metallic coating is on the textured surface.

11. The metallized film of claim 1, wherein the metallic coating is on the surface opposite to the textured surface.

12. The metallized film of claim 11, wherein the metallic coating is aluminum.

* * * * *

UNITED STATES PATENT AND TRADEMARK OFFICE
CERTIFICATE OF CORRECTION

PATENT NO. : 4,243,708
DATED : January 6, 1981
INVENTOR(S) : John W. Eustance; Stanley Y. Hobbs; Emilie L. Carley It is certified that error appears in the above-identified patent and that said Letters Patent are hereby corrected as shown below:

IN THE SPECIFICATION

Column 3, Line 21, Change "on" to an.

Column 10, Line 19, Change "zylyl" to xylyl.

Line 24, Change "Carbine" to Carbide.

Line 38, after (microns) cancel "and" and insert (.). The assembled capacitors were oven dried at a temperature in -
       Line 56, Change "φ" to δ

TABLE 3, Cancel "Test Volts" of Column 3.
       Change Column 2 to read Dielectric Test, Volts AC.

EXAMPLE II, Column 11, Line 34, Change "mm" to cm.

UNITED STATES PATENT AND TRADEMARK OFFICE
CERTIFICATE OF CORRECTION

PATENT NO. : 4,243,708
DATED : January 6, 1981
INVENTOR(S) : John W. Eustance et al.

It is certified that error appears in the above—identified patent and that said Letters Patent is hereby corrected as shown below:

EXAMPLE II,
Column 11, line 41, Change "VKAR" to --KVAR--.

Signed and Sealed this

Twenty-third Day of June 1981

[SEAL]

Attest:

RENE D. TEGTMEYER

Attesting Officer    Acting Commissioner of Patents and Trademarks

UNITED STATES PATENT AND TRADEMARK OFFICE
CERTIFICATE OF CORRECTION

PATENT NO. : 4,243,708
DATED : Jan. 6, 1981
INVENTOR(S) : John W. Eustance; Stanley Y. Hobbs; Emilie L. Carley It is certified that error appears in the above-identified patent and that said Letters Patent are hereby corrected as shown below:

In the title sheet item (60) delete "Pat. No. 3,964,735" and substitute therefore -now abandoned-

*Signed and Sealed this*

*Twenty-fourth* Day of *August 1982*

|SEAL|

*Attest:*

GERALD J. MOSSINGHOFF

*Attesting Officer*     *Commissioner of Patents and Trademarks*